(12) United States Patent
Wu et al.

(10) Patent No.: US 9,819,310 B2
(45) Date of Patent: Nov. 14, 2017

(54) APPARATUS AND METHODS FOR MULTI-MODE POWER AMPLIFIERS

(71) Applicant: SKYWORKS SOLUTIONS, INC., Woburn, MA (US)

(72) Inventors: Andy Cheng Pang Wu, Camarillo, CA (US); Younkyu Chung, Seoul (KR)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/262,416

(22) Filed: Sep. 12, 2016

(65) Prior Publication Data

US 2017/0093339 A1    Mar. 30, 2017

Related U.S. Application Data

(60) Provisional application No. 62/234,370, filed on Sep. 29, 2015.

(51) Int. Cl.
| | |
|---|---|
| *H03F 3/195* | (2006.01) |
| *H03F 1/02* | (2006.01) |
| *H03F 3/24* | (2006.01) |
| *H03F 3/72* | (2006.01) |

(52) U.S. Cl.
CPC ......... *H03F 1/0216* (2013.01); *H03F 1/0261* (2013.01); *H03F 1/0277* (2013.01); *H03F 3/195* (2013.01); *H03F 3/245* (2013.01); *H03F 3/72* (2013.01); *H03F 2200/255* (2013.01); *H03F 2200/318* (2013.01); *H03F 2200/336* (2013.01); *H03F 2200/411* (2013.01); *H03F 2200/421* (2013.01); *H03F 2200/423* (2013.01); *H03F 2200/451* (2013.01); *H03F 2200/555* (2013.01); *H03F 2203/7233* (2013.01); *H03F 2203/7236* (2013.01)

(58) Field of Classification Search
CPC .................................. H03F 3/195; H03F 3/187
See application file for complete search history.

(56) References Cited

U.S. PATENT DOCUMENTS

| | | | | |
|---|---|---|---|---|
| 5,374,966 A | * | 12/1994 | Weigand | H03F 1/56 330/104 |
| 7,382,186 B2 | | 6/2008 | Apel et al. | |
| 7,915,959 B2 | | 3/2011 | Shibata | |
| 8,130,043 B2 | | 3/2012 | Arell | |

(Continued)

*Primary Examiner* — Tuan H Nguyen
(74) *Attorney, Agent, or Firm* — Knobbe Martens Olson & Bear LLP

(57) ABSTRACT

Apparatus and methods for multi-mode power amplifiers are provided herein. In certain configurations, a wireless device includes a multi-mode power amplifier including a plurality of amplification paths electrically connected in parallel with one another. The plurality of amplification paths includes a first amplification path including an input stage of a first stage type and an output stage of a second stage type, and a second amplification path including an output stage of the second stage type. The first stage type provides non-inverting gain and the second stage type provides inverting gain. The wireless device further includes a transceiver that provides a radio frequency signal to the multi-mode power amplifier, and that operates the multi-mode power amplifier in a selected power mode chosen from a plurality of power modes based on selectively activating one or more of the plurality of amplification paths.

20 Claims, 7 Drawing Sheets

(56) References Cited

U.S. PATENT DOCUMENTS

| | | | |
|---|---|---|---|
| 8,610,503 B2 * | 12/2013 | Kaczman | ............... H03F 1/083 330/124 R |
| 8,773,206 B2 | 7/2014 | Chen et al. | |
| 9,455,669 B2 | 9/2016 | Modi et al. | |

* cited by examiner

APPARATUS AND METHODS FOR MULTI-MODE POWER AMPLIFIERS

CROSS-REFERENCE TO RELATED APPLICATIONS

This application claims the benefit of priority under 35 U.S.C. §119(e) of U.S. Provisional Patent Application No. 62/234,370, filed Sep. 29, 2015 and titled "APPARATUS AND METHODS FOR MULTI-MODE POWER AMPLIFIERS," which is herein incorporated by reference in its entirety.

BACKGROUND

Field

Embodiments of the invention relate to radio frequency (RF) electronic systems, and in particular, to power amplifier systems.

Description of the Related Technology

Power amplifiers can be used to amplify radio frequency (RF) signals for transmission. For example, power amplifiers can be included in mobile devices and base stations to amplify signals of a wide range of frequencies, such as RF signals in a frequency range of about 30 kHz to 300 GHz, for instance, in the range of about 450 MHz to about 4 GHz for certain communications standards.

When communicating using a cellular standard, a wireless local area network (WLAN) standard, and/or any other suitable communication standard, a power amplifier can be used to amplify the RF signal to a power level suitable for transmission via an antenna. It can be important to manage the power of RF signal transmissions to prolong battery life and/or provide a suitable transmit power level.

SUMMARY

In certain embodiments, the present disclosure relates to a wireless device. The wireless device includes a multi-mode power amplifier including a plurality of amplification paths electrically connected in parallel with one another. The plurality of amplification paths include a first amplification path including an input stage of a first stage type and an output stage of a second stage type, and a second amplification path having a fewer number of stages relative to the first amplification path and including an output stage of the second stage type. The first stage type provides non-inverting gain and the second stage type provides inverting gain. The wireless device further includes a transceiver configured to provide a radio frequency signal to the multi-mode power amplifier, and to operate the multi-mode power amplifier in a selected power mode chosen from a plurality of power modes based on selectively activating one or more of the plurality of amplification paths.

In some embodiments, each of the plurality of amplification paths has about the same phase such that the multi-mode power amplifier is switchable amongst the plurality of power modes without phase discontinuity.

In various embodiments, the first stage type is a common-base amplifier stage and the second stage type is a common-emitter amplifier stage.

In several embodiments, the first stage type is a common-gate amplifier stage and the second stage type is a common-source amplifier stage.

According to some embodiments, the plurality of power modes includes a first power mode in which the first amplification path is activated and the second amplification path is deactivated, and a second power mode in which the first amplification path is deactivated and the second amplification path is activated.

In a number of embodiments, the wireless device further includes a third amplification path including an input stage of the first stage type and an output stage of the second stage type, and the transceiver is further configured operate the multi-mode power amplifier in the selected power mode based on selectively activating the third amplification path.

In various embodiments, the power amplifier further includes a bias circuit configured to bias the first amplification path based on the selected power mode. According to several embodiments, the bias circuit is configured to bias two or more of the plurality of amplification paths as a multi-throw switch.

In certain embodiments, the present disclosure relates to a multi-mode power amplifier including a first amplification path electrically connected between a radio frequency input and a radio frequency output, and a second amplification path electrically connected in parallel with the first amplification path between the radio frequency input and the radio frequency output. The first amplification path includes an input stage of a first stage type and an output stage of a second stage type. Additionally, the second amplification path has a fewer number of stages relative to the first amplification path and includes an output stage of the second stage type. The first stage type provides non-inverting gain and the second stage type provides inverting gain. The multi-mode power amplifier further includes a bias circuit configured to bias the first amplification and the second amplification path, the bias circuit configured to receive a mode control signal that is operable to control a power mode of the multi-mode power amplifier based on selectively activating the first amplification path and the second amplification path.

In some embodiments, the first amplification path and the second amplification path have about the same phase such that the multi-mode power amplifier is switchable amongst a plurality of power modes without phase discontinuity.

In various embodiments, the first stage type is a common-base amplifier stage and the second stage type is a common-emitter amplifier stage.

In several embodiments, the first stage type is a common-gate amplifier stage and the second stage type is a common-source amplifier stage.

In numerous embodiments, the multi-mode power amplifier is operable in a plurality of power modes including a first power mode in which the first amplification path is activated and the second amplification path is deactivated, and a second power mode in which the first amplification path is deactivated and the second amplification path is activated.

In a number of embodiments, the multi-mode power amplifier further includes a third amplification path including an input stage of the first stage type and an output stage of the second stage type, and the mode control signal is further operable to control the power mode of the multi-mode power amplifier based on selectively activating the third amplification path. In various embodiments, the power amplifier is configured to bias the input stage of the second amplification path and the input stage of the third amplification path as a multi-throw switch.

In certain embodiments, the present disclosure relates to a packaged module includes a package substrate, and an integrated circuit on the package substrate. The integrated circuit includes a multi-mode power amplifier including a plurality of amplification paths electrically connected in parallel with one another. The plurality of amplification paths includes a first amplification path including an input stage of a first stage type and an output stage of a second stage type, and a second amplification path having a fewer number of stages relative to the first amplification path and including an output stage of the second stage type. The first stage type provides non-inverting gain and the second stage type provides inverting gain. The multi-mode power amplifier further includes a bias circuit configured to receive a mode control signal that is operable to control a power mode of the multi-mode power amplifier based on selectively activating one or more of the plurality of amplification paths.

In some embodiments, each of the plurality of amplification paths has about the same phase such that the multi-mode power amplifier is switchable amongst a plurality of modes without phase discontinuity.

In various embodiments, the first stage type is a common-base amplifier stage and the second stage type is a common-emitter amplifier stage.

In a number of embodiments, the first stage type is a common-gate amplifier stage and the second stage type is a common-source amplifier stage.

According to several embodiments, the packaged module further includes a third amplification path including an input stage of the first stage type and an output stage of the second stage type. Additionally, the mode control signal further operable to control the power mode of the multi-mode power amplifier based on selectively activating the third amplification path.

In certain embodiments, the present disclosure relates to a wireless device including a power amplifier including a plurality of amplification paths electrically connected in parallel with one another between a radio frequency input and a radio frequency output. The plurality of amplification paths includes a first amplification path that includes a common-base input stage and a common-emitter output stage. The wireless device further includes a transceiver configured to provide a radio frequency input signal to the radio frequency input of the power amplifier, and the transceiver is further configured to operate the power amplifier in a selected power mode chosen from a plurality of power modes by selectively activating at least a portion of the plurality of amplification paths.

In some embodiments, each of the plurality of amplification paths has about the same phase such that the multi-mode power amplifier is switchable amongst the plurality of power modes without phase discontinuity.

In various embodiments, the power amplifier further includes a bias circuit configured to bias the plurality of amplification paths based on the selected power mode.

In a number of embodiments, the transceiver provides one or more mode control signals to the bias circuit of the power amplifier to control the selected power mode. In several embodiments, the bias circuit is configured to bias the common base input stage to selectively activate or deactivate the first amplification path.

According to some embodiments, the plurality of amplification paths further includes a second amplification path including a common-emitter output stage. In numerous embodiments, the second amplification path includes a fewer number of stages than then first amplification path. In several embodiments, the plurality of amplification paths further includes a third amplification path including a common-base input stage and a common-emitter output stage.

In some embodiments, the plurality of power modes includes a low power mode, a medium power mode, and a high power mode.

In certain embodiments, the present disclosure relates to a multi-mode power amplifier including a radio frequency input, a radio frequency output, and a plurality of amplification paths electrically connected in parallel with one another between the radio frequency input and the radio frequency output. At least a portion of the amplification paths are selectively activatable to operate the multi-mode power amplifier in a selected power mode chosen from a plurality of power modes. The plurality of amplification paths including a first amplification path that includes a first common-base input stage and a first common-emitter output stage.

In some embodiments, the each of the plurality of amplification paths has about the same phase such that the multi-mode power amplifier is switchable amongst the plurality of power modes without phase discontinuity.

In various embodiments, the multi-mode power amplifier further includes a bias circuit configured to bias the plurality of amplification paths based on the selected power mode. In several embodiments, the bias circuit selectively activates or deactivates the first amplification path based on biasing the common base input stage of the first amplification path.

According to a number of embodiments, the plurality of amplification paths further includes a second amplification path including a common-emitter output stage. In various embodiments, the second amplification path includes a fewer number of stages than then first amplification path. In several embodiments, the plurality of amplification paths further includes a third amplification path including a common-base input stage and a common-emitter output stage.

In various embodiments the plurality of power modes includes a low power mode, a medium power mode, and a high power mode.

In certain embodiments, the present disclosure relates to a method of radio frequency amplification using a multi-mode power amplifier. The method includes receiving a radio frequency input signal at a radio frequency input to the multi-mode power amplifier, the multi-mode power amplifier including a plurality of amplification paths electrically connected in parallel with one another between the RF input and an RF output. The method further includes operating the multi-mode power amplifier in a selected power mode chosen from a plurality of power modes, including selectively activating at least a portion of the plurality of amplification paths based on the selected power mode. The method further includes amplifying the radio frequency input signal to generate an amplified radio frequency output signal on the radio frequency output, the plurality of amplification paths including a first amplification path that includes a common-base input stage and a common-emitter output stage.

In a number of embodiments, the method further includes switching amongst the plurality of power modes without phase discontinuity at the radio frequency output of the multi-mode power amplifier.

In some embodiments, the method further includes biasing the plurality of amplification paths based on the selected power mode using a bias circuit.

DETAILED DESCRIPTION OF EMBODIMENTS

Figure 1:
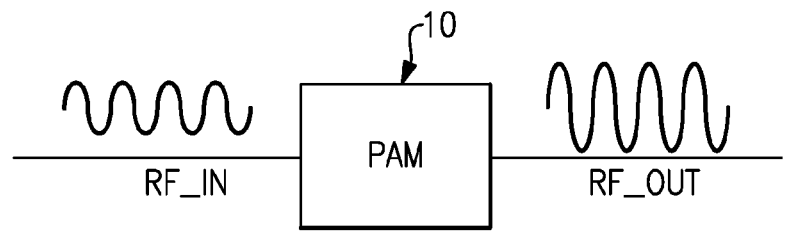
FIG. 1 is a schematic diagram of a power amplifier module for amplifying a radio frequency (RF) signal.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A power amplifier can operate with a power level that changes over time. In one example, a usage profile of a mobile phone by a user can follow a probability density function in which it is more likely that the power amplifier will be operated below a maximum power level. The usage profile can vary with carrier system design as well as with operating conditions and/or environment. In another example, a power amplifier provides amplification to a radio frequency signal that has a signal envelope that changes over time, for instance, a code division multiple access (CDMA), wideband code division multiple access (WCDMA), or Long Term Evolution (LTE) signal.

Since a power amplifier can suffer from reduced efficiency and/or degraded linearity at back-off power levels, the power amplifier can be operated in one of a plurality of power modes to transmit signals efficiently. Configuring a power amplifier to operate in multiple power modes can prolong battery life of a mobile device by increasing the efficiency of transmissions and/or achieving a relatively low quiescent current when the mobile device is idle.

In one example, a power amplifier is operable in a high power mode, a medium or mid power mode, or a low power mode. The power mode of the power amplifier is changed over time to achieve an appropriate transmission power level at a particular time instance. In certain applications, a usage profile of the mobile device can be such that the mobile handset transmits less than 0 dBm 65% or more of the time. In such applications, an efficiency of the power amplifier in the low power mode can be particularly important in extending battery life.

Although configuring a power amplifier to be operable in multiple power modes can increase power efficiency, such a configuration can also adversely impact the performance of the power amplifier. For instance, when the power amplifier is switched from one power mode to another power mode, the power amplifier may exhibit a relatively abrupt change of phase that generates a phase discontinuity in the transmitted signal. When the phase discontinuity is sufficiently large, the mobile device's error vector magnitude (EVM) can be degraded.

Apparatus and methods for multi-mode power amplifiers are provided herein. In certain configurations, a wireless device includes a multi-mode power amplifier including a plurality of amplification paths electrically connected in parallel with one another. The plurality of amplification paths includes a first amplification path including an input stage of a first stage type and an output stage of a second stage type, and a second amplification path including an output stage of the second stage type. The first stage type provides non-inverting gain and the second stage type provides inverting gain. The wireless device further includes a transceiver that provides a radio frequency signal to the multi-mode power amplifier, and that operates the multi-mode power amplifier in a selected power mode chosen from a plurality of power modes based on selectively activating one or more of the plurality of amplification paths.

In certain configurations, the first stage type is a common-base amplifier stage and the second stage type is a common-emitter amplifier stage.

A common-emitter amplifier stage provides inverting gain, and thus generates an output signal that is about 180° out-of-phase with respect to an input signal. In contrast, a common-base amplifier stage generates an output signal that is in-phase with respect to an input signal.

Configuring the first amplification path to employ both a common-base input stage and a common-emitter output stage can reduce or eliminate a phase discontinuity associated with switching the power amplifier from a first power mode associated with the first amplification path to a second power mode associated with the second amplification path.

In certain configurations, a power amplifier includes amplification paths implemented with a combination of common-emitter and common-base stages to substantially match the phase of each of the amplification paths. Thus, the power amplifier can maintain phase matching between different power modes even when the power amplifier's amplification paths do not each include the same number of amplification stages.

Thus, the power amplifier can operate with improved performance, including, for example, smaller phase discontinuity versus power mode and/or enhanced EVM performance. Moreover, an amplification path associated with a low power mode can be implemented using a fewer number of stages relative to one or more amplification paths with higher power. Thus, DC power consumption can advantageously be reduced. Furthermore, the power amplifier can be implemented without needing to include phase shifting circuits, which can increase size and/or complexity.

In contrast, conventional multi-mode power amplifiers can include phase shifters to compensate for phase differences through different amplification paths of the power amplifier.

Accordingly, the power amplifiers herein can have lower DC power consumption, superior performance, lower cost, and/or decreased complexity.

Moreover, a common-base input stage of an amplification path can be operated as a switch to selectively activate the amplification path. For example, a bias circuit can be used to bias a base of a bipolar transistor of the common-base input stage. Additionally, the bias circuit can receive a mode control signal indicating the power mode of the power amplifier, and the bias circuit can control the biasing of the base of the bipolar transistor of the common-base input stage based on the power mode.

When the mode control signal indicates that the amplification path should be activated, the bias circuit can bias the base of the bipolar transistor such that the common-base input stage provides amplification. However, when the mode control signal indicates that the amplification path should be deactivated, the bias circuit can bias the base of the bipolar transistor to provide high impedance between the bipolar transistor's collector and emitter, thereby deactivating the amplification path.

Accordingly, a common-base input stage of an amplification path can advantageously be used not only to provide amplification when the amplification path is active, but also as an input switch to select the amplification path. When two or more amplification paths include a common-base input stage, such common-base input stages can operate as a multi-throw switch.

The power amplifiers herein can exhibit superior phase performance, such as reduced or eliminated phase discontinuity when switching the power amplifier between power modes. The teachings herein can also be used to advantageously reduce a number of input switches of a multi-mode power amplifier, thereby lowering cost, decreasing size, reducing component count, and/or reducing insertion loss relative to a configuration including an explicit input switch for each amplification path.

The teachings herein also applicable to field-effect transistor (FET) configurations, such as metal oxide semiconductor (MOS) transistor implementations. For example, in certain configurations, the first stage type is a common-gate amplifier stage and the second stage type is a common-source amplifier stage.

Configuring the first amplification path to employ both a common-gate input stage and a common-source output stage can reduce or eliminate a phase discontinuity associated with switching the power amplifier from a first power mode associated with the first amplification path to a second power mode associated with the second amplification path. Thus, a multi-mode power amplifier can include multiple amplification paths each implemented with a combination of common-source and common-gate stages to substantially match the phase of each of the amplification paths. Thus, the power amplifier can maintain phase matching between different power modes even when the power amplifier's amplification paths do not each include the same number of amplification stages.

FIG. 1 is a schematic diagram of a power amplifier module (PAM) 10 for amplifying a radio frequency (RF) signal. The illustrated power amplifier module 10 amplifies an RF signal (RF_IN) to generate an amplified RF signal (RF_OUT). The power amplifier module 10 can be implemented using one or more features of the present disclosure.

Figure 2:
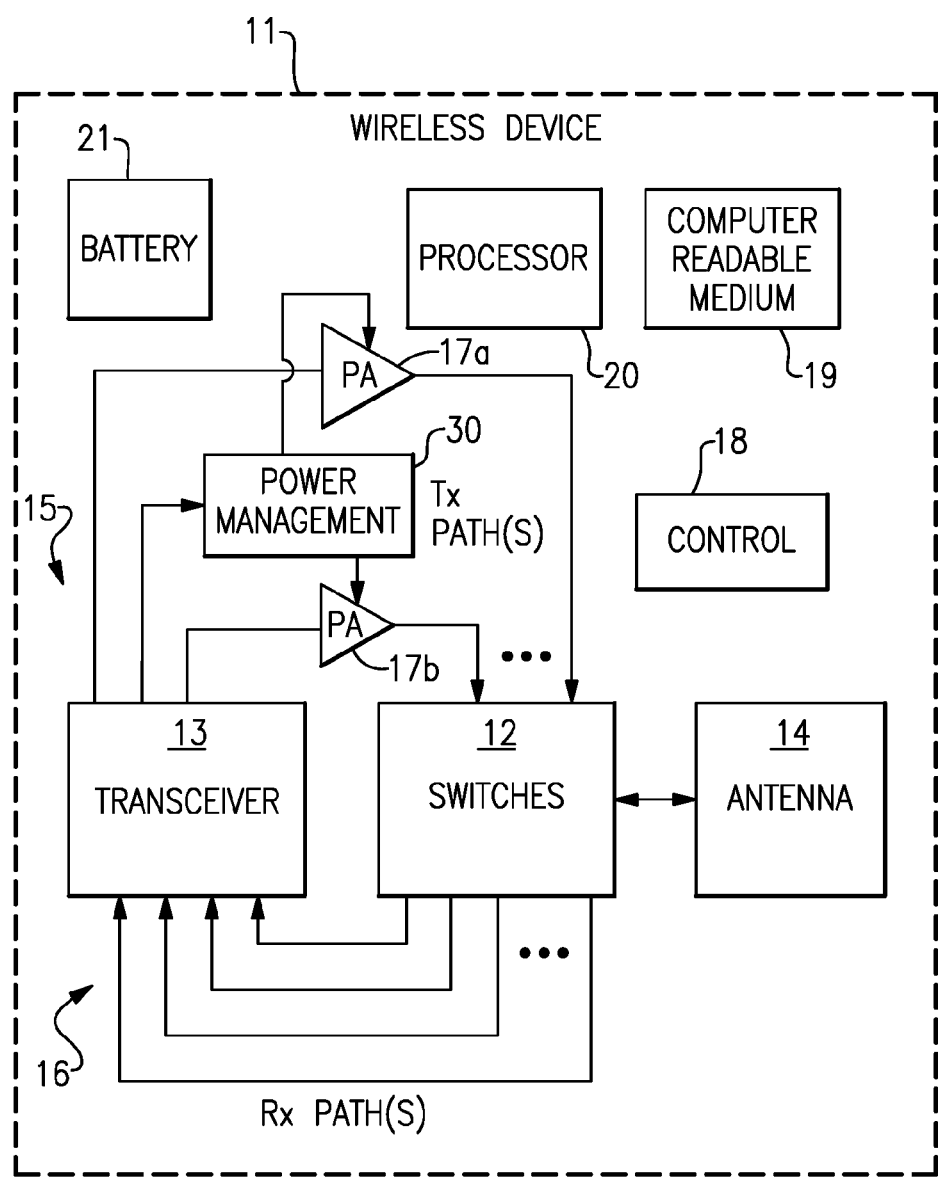
FIG. 2 is a schematic diagram of an example wireless device.

FIG. 2 is a schematic block diagram of an example wireless or mobile device 11. The wireless device 11 can include one or more power amplifiers implemented using one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more radio frequency spectrum bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver 13, an antenna 14, power amplifiers 17a, 17b, a control component 18, a computer readable medium 19, a processor 20, a battery 21, and a power management system 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands.

Although FIG. 2 illustrates a configuration using two transmission paths 15 and two power amplifiers 17a, 17b, the wireless device 11 can be adapted to include more or fewer transmission paths 15 and/or more or fewer power amplifiers. The first power amplifier 17a and/or the second power amplifier 17b can be implemented as multi-mode power amplifiers in accordance with the teachings herein.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17a, 17b, the power management system 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the power management system 30, which can be used to provide power amplifier supply voltages to one or more of the power amplifiers 17a, 17b. For example, the power management system 30 can be configured to change the supply voltages provided to the power amplifiers 17a, 17b to improve efficiency, such as power added efficiency (PAE). The power management system 30 can be used to provide, for example, average power tracking (APT) and/or envelope tracking (ET).

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Figure 3:
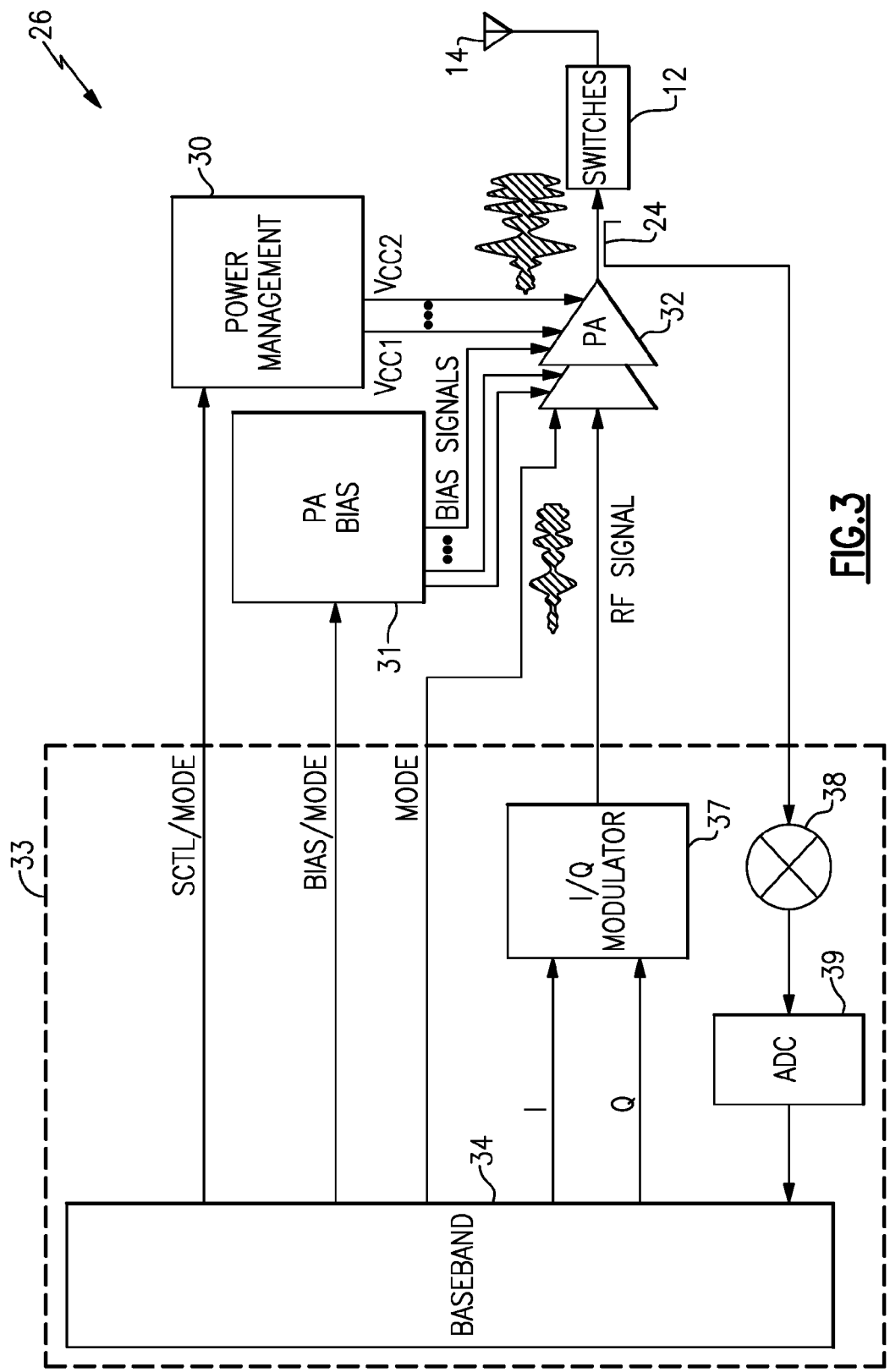
FIG. 3 is a schematic diagram of one embodiment of a power amplifier system.

FIG. 3 is a schematic block diagram of one example of a power amplifier system 26. The illustrated power amplifier system 26 includes the switches 12, the antenna 14, a directional coupler 24, a power management system 30, a power amplifier bias circuit 31, a multi-mode power amplifier 32, and a transceiver 33. The illustrated transceiver 33 includes a baseband processor 34, an I/Q modulator 37, a mixer 38, and an analog-to-digital converter (ADC) 39. Although not illustrated in FIG. 3 for clarity, the transceiver 33 can include circuitry associated with receiving signals over one or more receive paths.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave.

In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by the multi-mode power amplifier 32. In certain implementations, the I/Q modulator 37 can include one or more filters configured to filter frequency content of signals processed therein.

The power amplifier bias circuit 31 receives a bias control signal BIAS from the transceiver 33, and generates bias signals for the multi-mode power amplifier 32. The bias signals can include current and/or voltage signals, and can be used, for example, to bias the bases of bipolar transistors associated with the power amplifier's stages.

In certain configurations, the bias signals generated by the power amplifier bias circuit 31 control in part a selected power mode (for example, high power mode, medium power mode, or low power mode) of the multi-mode power amplifier 32. For example, in certain implementations, the power amplifier bias circuit 31 receives a mode control signal MODE from the transceiver 33, and uses the mode control signal MODE to control generation of the bias signals.

The multi-mode power amplifier 32 can receive the RF signal from the I/Q modulator 37 of the transceiver 33, and when enabled can provide an amplified RF signal to the antenna 14 via the switches 12. The directional coupler 24 can be positioned between the output of the multi-mode power amplifier 32 and the input of the switches 12, thereby allowing an output power measurement of the multi-mode power amplifier 32 that does not include insertion loss of the switches 12. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the multi-mode power amplifier 32 and the baseband processor 34, the baseband processor 34 can be configured to dynamically adjust the I and Q signals to optimize the operation of the power amplifier system 26.

For example, configuring the power amplifier system 26 in this manner can aid in controlling the PAE and/or linearity of the multi-mode power amplifier 32. However, other configurations of power control can be used.

In the illustrated configuration, the multi-mode power amplifier 32 also receives a mode control signal MODE from the transceiver 33. The mode control signal MODE can be used, for example, to control switches used to select which amplification paths of the power amplifier are active.

In certain configurations, the mode control signal MODE provided to the multi-mode power amplifier 32 and the bias control signal BIAS provided to the power amplifier bias circuit 31 are both used in part to control a power level of the multi-mode power amplifier 32. In certain implementations, the transceiver 33 provides the mode control signal MODE and/or the bias control signal BIAS over an interface, such as a serial peripheral interface (SPI) or Mobile Industry Processor Interface (MIPI).

The power management system 30 receives a supply control signal SCTL from the transceiver 33, and generates one or more power amplifier supply voltages for the multi-mode power amplifier 32. In certain configurations, the power management system 30 receives can also control generation of the one or more power amplifier supply voltages based on the mode control signal MODE.

In the illustrated configuration, the power management system 30 generates a first power amplifier supply voltage $V_{cc2}$ and a second power amplifier supply voltage $V_{cc2}$. However, other configurations are possible, including, for example, configurations with more or fewer power amplifier supply voltages.

The power amplifier system 26 illustrates another example of a radio frequency system that can include one or more power amplifiers implemented using one or more features of the present disclosure.

Figure 4:
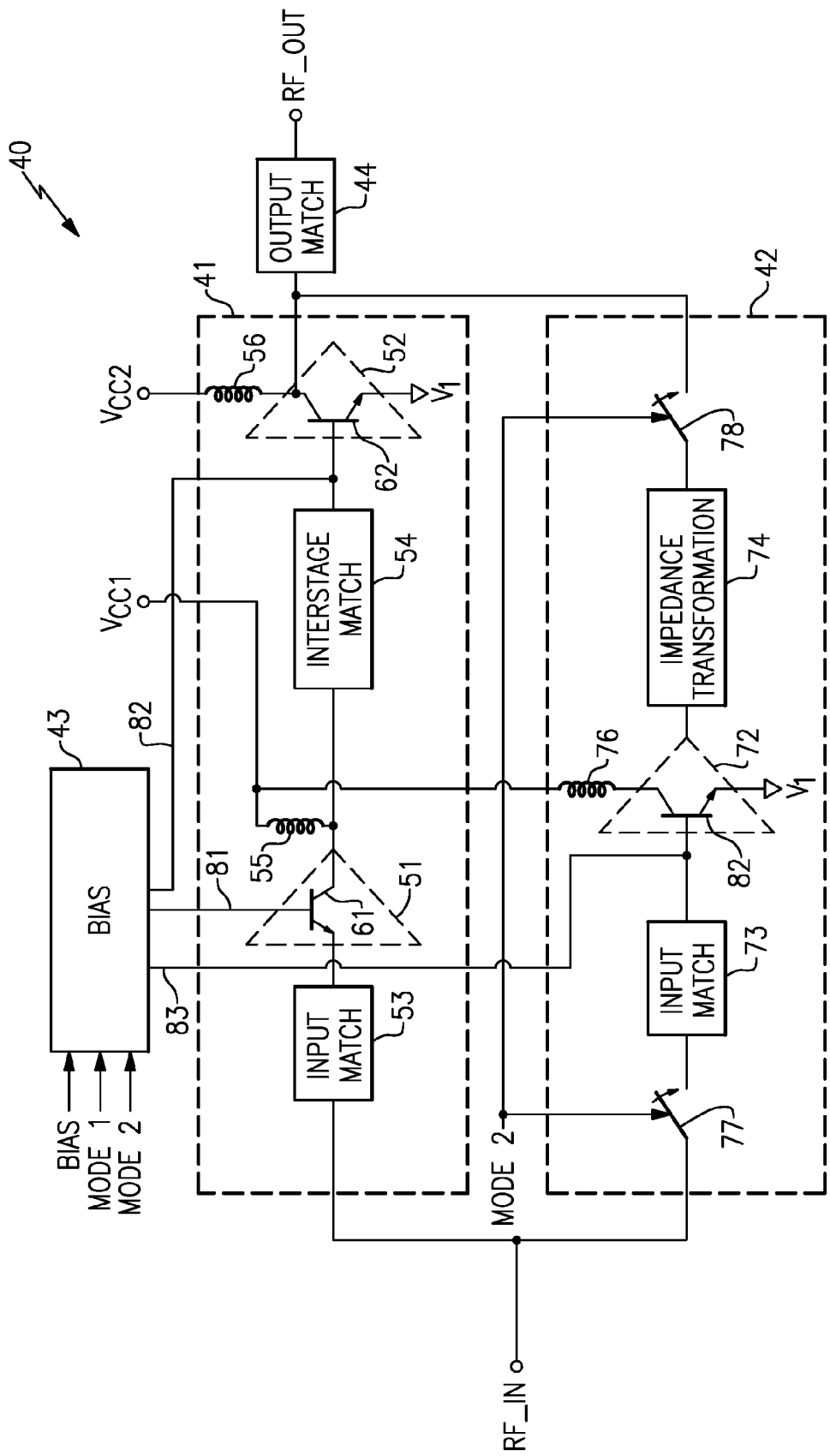
FIG. 4 is a schematic diagram of one embodiment of a multi-mode power amplifier.

FIG. 4 is a schematic diagram of one embodiment of a multi-mode power amplifier 40. The power amplifier 40 includes a first amplification path 41, a second amplification path 42, a bias circuit 43, and an output matching circuit 44. The power amplifier 40 further includes a radio frequency (RF) input RF_IN and a radio frequency output RF_OUT.

Although FIG. 4 illustrates a configuration in which the power amplifier 40 includes two amplification paths, other configurations are possible, including, for example, configurations in which a power amplifier includes three or more amplification paths.

The power amplifier 40 further receives a first mode control signal MODE1 and a second signal MODE2, which are used to operate the power amplifier 40 in a selected power mode chosen from a plurality of different power modes. The power amplifier 40 further receives a first power amplifier supply voltage $V_{CC1}$ and a second power amplifier supply voltage $V_{CC2}$, which are used to power the power amplifier's amplification stages. Although FIG. 4 illustrates a configuration in which a power amplifier receives two mode control signals and two power amplifier supply voltages, other configurations are possible, including, for example, configurations in which a power amplifier receives more or fewer mode control signals and/or more or fewer power amplifier supply voltages.

As shown in FIG. 4, the first and second amplification paths 41, 42 are electrically connected in parallel with one another. For example, an input of the first amplification path 41 and an input of the second amplification path are both electrically connected to the RF input RF_IN, and the an output of the first amplification path 41 and an output of the second amplification path 42 are both electrically connected to the RF output RF_OUT via the output matching circuit 44.

The first amplification path 41 includes a common-base input stage 51, a common-emitter output stage 52, an input matching circuit 53, an intermediate stage matching circuit 54, an input stage inductor or choke 55, and an output stage inductor 56. The second amplification path 42 includes a common-emitter output stage 72, an input matching circuit 73, an impedance transformation circuit 74, an output stage inductor 76, an input switch 77, and an output switch 78.

Although one configuration of the first and second amplification paths is shown, the first and second amplification paths can be implemented in other ways. For example, although the illustrated configuration includes a first amplification path with two stages and a second amplification stage with one stage, the first amplification path and/or the second amplification path can include additional stages.

As will be appreciated by persons having ordinary skill in the art, the input matching circuit 53, the input matching circuit 73, the interstage matching circuit 54, and the output matching circuit 44 provide impedance matching, thereby enhancing RF performance. Additionally, the impedance transformation circuit 74 can aid in combining signals generated using the first and the second amplification paths 41, 42 and/or in obtaining desired load line impedance for the first and second output stages 52, 72. For example, in certain configurations the impedance transformation circuit 74 is used to provide different load line impedance values for the first and second output stages 52, 72, thereby improving efficiency relative to a configuration in which the first and second output stages 52, 72 operate with the same load line impedance.

As shown in FIG. 4, the common-base input stage 51 of the first amplification path 41 includes a first bipolar transistor 61 implemented in a common-base configuration, and the common-emitter output stage 52 of the first amplification path 41 includes a second bipolar transistor 62 implemented in a common-emitter configuration. Additionally, the common-emitter output stage 72 of the second amplification path 42 includes a third bipolar transistor 82 implemented in a common-emitter configuration.

The base of the first bipolar transistor 61 receives a first bias signal 81 from the bias circuit 43, the base of the second bipolar transistor 62 receives a second bias signal 82 from the bias circuit 43, and the base of the third bipolar transistor 63 receives a third bias signal 83 from the bias circuit 43. The bias circuit 43 receives a bias control signal BIAS, which is used to control biasing levels of the first to third bias signals 81-83.

The collector of the first bipolar transistor 61 is electrically connected to the first power amplifier supply voltage $V_{CC1}$ through the input stage inductor 55. The collector of the second bipolar transistor 62 is electrically connected to the second power amplifier supply voltage $V_{CC2}$ through the output stage inductor 55, and the emitter of the second bipolar transistor 62 is electrically connected to a first voltage $V_1$, which can be, for example, ground. The collector of the third bipolar transistor 82 is electrically connected to the first power amplifier supply voltage $V_{CC1}$ through the output stage inductor 76, and the emitter of the third bipolar transistor 82 is electrically connected to the first voltage $V_1$.

When the first amplification path 41 is active in a particular power mode, an RF input signal from the RF input RF_IN is received at the emitter of the first bipolar transistor 61, and the first bipolar transistor 61 amplifies the RF input signal to generate an amplified RF signal at the collector of the first bipolar transistor 61. Since the first bipolar transistor 61 is implemented in a common-base configuration, the common-base input stage 51 generates an amplified RF signal that is in-phase with respect to the RF input signal. The amplified RF signal is provided to the base of the second bipolar transistor 62, which further amplifies the amplified RF signal to generate an RF output signal that is provided to the RF output RF_OUT. Since the second bipolar transistor 62 is implemented in a common-emitter configuration, the common-emitter output stage 52 provides inverting amplification, and thus the amplified RF signal received at the base of the second bipolar transistor 62 is about 180° out-of-phase with respect to the RF output signal generated at the collector of the second bipolar transistor 62.

When the second amplification path 42 is active in a particular power mode, the RF input signal from the RF input RF_IN is received at the base of the third bipolar transistor 82, and the third bipolar transistor 82 amplifies the RF input signal to generate an RF output signal that is provided to the RF output RF_OUT. Since the third bipolar transistor 82 is implemented in a common-emitter configuration, the common-emitter output stage 72 provides inverting amplification or gain and generates an RF output signal that is about 180° out-of-phase with respect to RF input signal.

In the illustrated configuration, both the first and second amplification paths 41, 42 generate an RF output signal that is about 180° out-of-phase with respect to a received RF input signal. Thus, the power amplifier 40 can be transitioned from one power mode to another power mode with reduced or eliminated phase discontinuity.

In contrast, implementing the first amplification path using common-emitter stages for both input and output stages can generate a phase mismatch between the first and second amplification paths. For example, such a configuration can result in a phase difference of about 180 degrees.

The power amplifier 40 of FIG. 4 can provide high efficiency transmissions by using multiple amplification paths that are selectable based on power mode, and avoids a need for phase shifting circuits to compensate for phase differences between the amplification paths. The power amplifier 40 provides phase matching between different power modes even though the first and second amplification paths 41, 42 include a different number of amplification stages. Thus, the second amplification path 42 can serve a low power amplification path having fewer stages relative the first amplification path, which can serve as a mid or high power amplification path. Implementing the second amplification path 42 with fewer stages reduces DC power consumption.

Thus, the power amplifier 40 can operate with improved performance, including, for example, smaller phase discontinuity versus power mode and/or enhanced EVM performance. Additionally, the power amplifier 40 can exhibit lower DC power consumption, superior performance, lower cost and/or decreased complexity.

Moreover, the illustrated power amplifier 40 operates without an input switch for the first amplification path 41. Rather, the bias circuit 43 is used to bias the base of the first bipolar transistor 61 based on the first and/or second mode control signals MODE1, MODE2. When the mode control signals indicate that the first amplification path 41 should be activated, the bias circuit 41 biases the base of the first bipolar transistor 61 such that the common-base input stage 51 provides amplification. However, when the mode control signal indicates that the first amplification path 41 should be deactivated, the bias circuit 43 biases the base of the first bipolar transistor 61 to provide high impedance between the first bipolar transistor's collector and emitter, thereby deactivating the first amplification path 41.

Configuring the power amplifier 40 in this manner not only reduces complexity and component count by eliminating an input switch, but also improves performance by reducing insertion loss of the first amplification path 41 relative to a configuration including an explicit input switch.

Additional details of the power amplifier 40 can be as described earlier.

Figure 5:
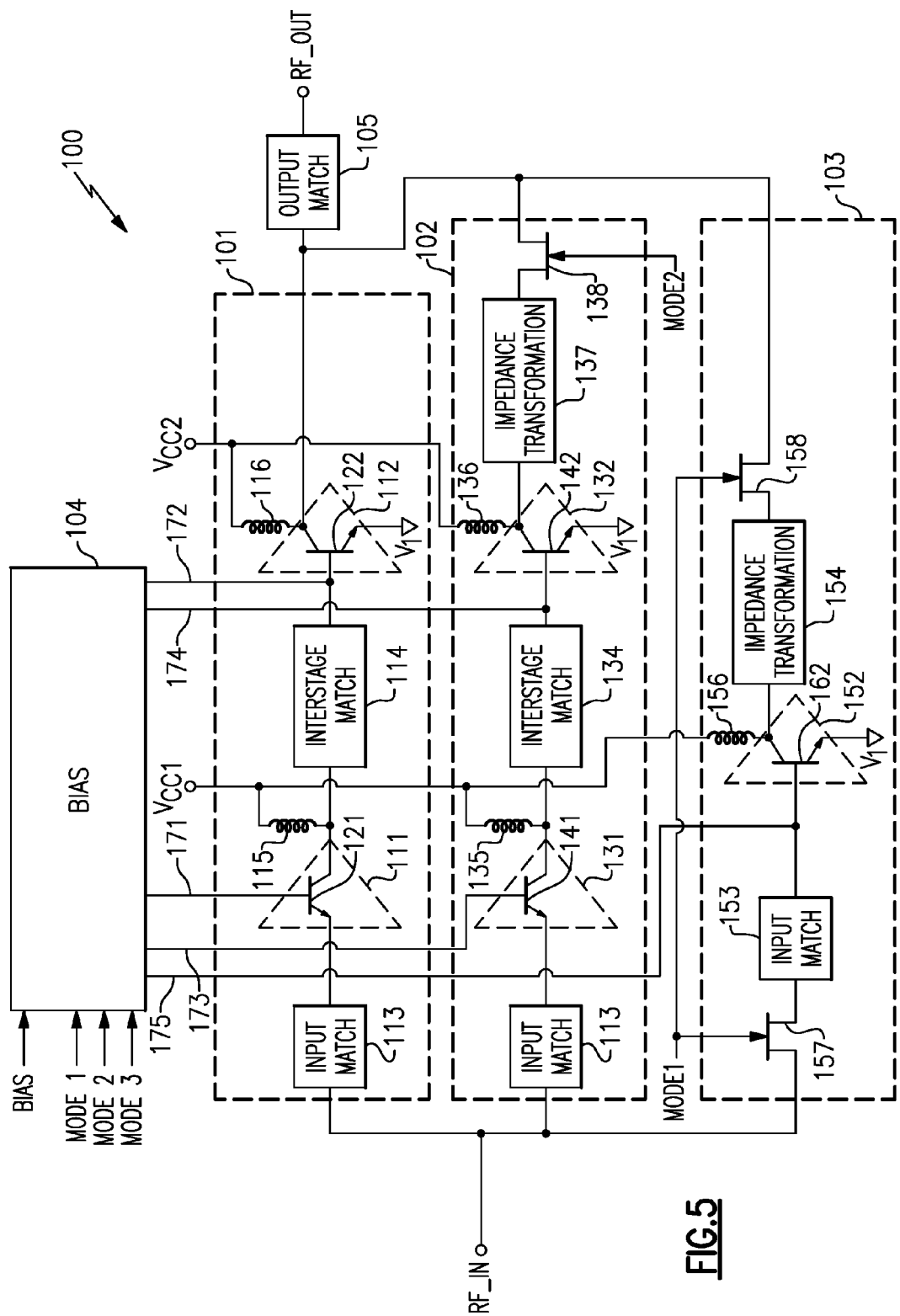
FIG. 5 is a schematic diagram of another embodiment of a multi-mode power amplifier.

FIG. 5 is a schematic diagram of another embodiment of a multi-mode power amplifier 100. The multi-mode power amplifier 100 includes a first amplification path 101, a second amplification path 102, a third amplification path 103, a bias circuit 104, and an output matching circuit 105. The power amplifier 100 further includes an RF input RF_IN and a radio frequency output RF_OUT.

The power amplifier 40 receives a first mode control signal MODE1, a second signal MODE2, and a third mode control signal MODE3, which are used to operate the power amplifier 100 in a selected power mode chosen from a plurality of different power modes including three or more modes. The power amplifier 100 further receives a first power amplifier supply voltage $V_{CC1}$ and a second power amplifier supply voltage $V_{CC2}$, which are used to power the power amplifier's amplification stages.

The first amplification path 101 includes a common-base input stage 111, a common-emitter output stage 112, an input matching circuit 113, an interstage matching circuit 114, an input stage inductor or choke 115, and an output stage inductor 116. The common-base input stage 111 includes a first bipolar transistor 121 that receives a first bias signal 171 from the bias circuit 104, and the common-emitter output stage 112 includes a second bipolar transistor 122 that receives a second bias signal 172 from the bias circuit 104.

With continuing reference to FIG. 5, the second amplification path 102 includes a common-base input stage 131, a common-emitter output stage 132, an input matching circuit 133, an interstage matching circuit 134, an input stage inductor 135, an output stage inductor 136, an impedance transformation circuit 137, and an output switch 138. The common-base input stage 131 includes a third bipolar transistor 141 that receives a third bias signal 173 from the bias circuit 104, and the common-emitter output stage 132 includes a fourth bipolar transistor 142 that receives a fourth bias signal 174 from the bias circuit 104.

The third amplification path 103 includes a common-emitter output stage 152, an input matching circuit 153, an output stage inductor 156, an impedance transformation circuit 157, an input switch 157, and an output switch 158. The common-emitter output stage 152 includes a fifth bipolar transistor 162 that receives fifth bias signal 175 from the bias circuit 104.

As shown in FIG. 5, the bias circuit 104 receives the bias control signal BIAS, which can be used to control the bias levels of the bias signals 171-175.

In the illustrated configuration, input switch 157 and output switches 138, 158 are implemented using field-effect transistors (FETs). However, other implementations are possible.

In one embodiment, the first amplification path 101 is used in a high power mode, the second amplification path 102 is used in a mid-power mode, and the third amplification path 103 is used in a low power mode.

The power amplifier 100 includes amplification paths 101-103 implemented with a combination of common-emitter and common-base stages to substantially match the phase of each of the amplification paths 101-103. Thus, the power amplifier 100 can maintain phase matching between different power modes even though the power amplifier's amplification paths do not each include the same number of amplification stages.

Thus, the power amplifier 100 can operate with improved performance, including, for example, smaller phase discontinuity versus power mode and/or enhanced EVM performance. Moreover, the third amplification path 103 associated with a low power mode can be implemented using a fewer number of stages relative to first and second amplification paths 101, 102 with higher power to advantageously reduce DC power consumption. Furthermore, the illustrated power amplifier 100 is implemented without phase shifting circuits, which can increase size and/or complexity.

The illustrated power amplifier 100 of FIG. 5 operates without an input switch for the first and second amplification paths 101, 102. Rather, the bias circuit 104 is used to bias the base of the first bipolar transistor 121 and third bipolar transistor 141 based on the first mode control signal MODE1, the second mode control signal MODE2, and/or the third mode control signal MODE3.

Additional details of the power amplifier 100 can be as described earlier.

Figure 6:
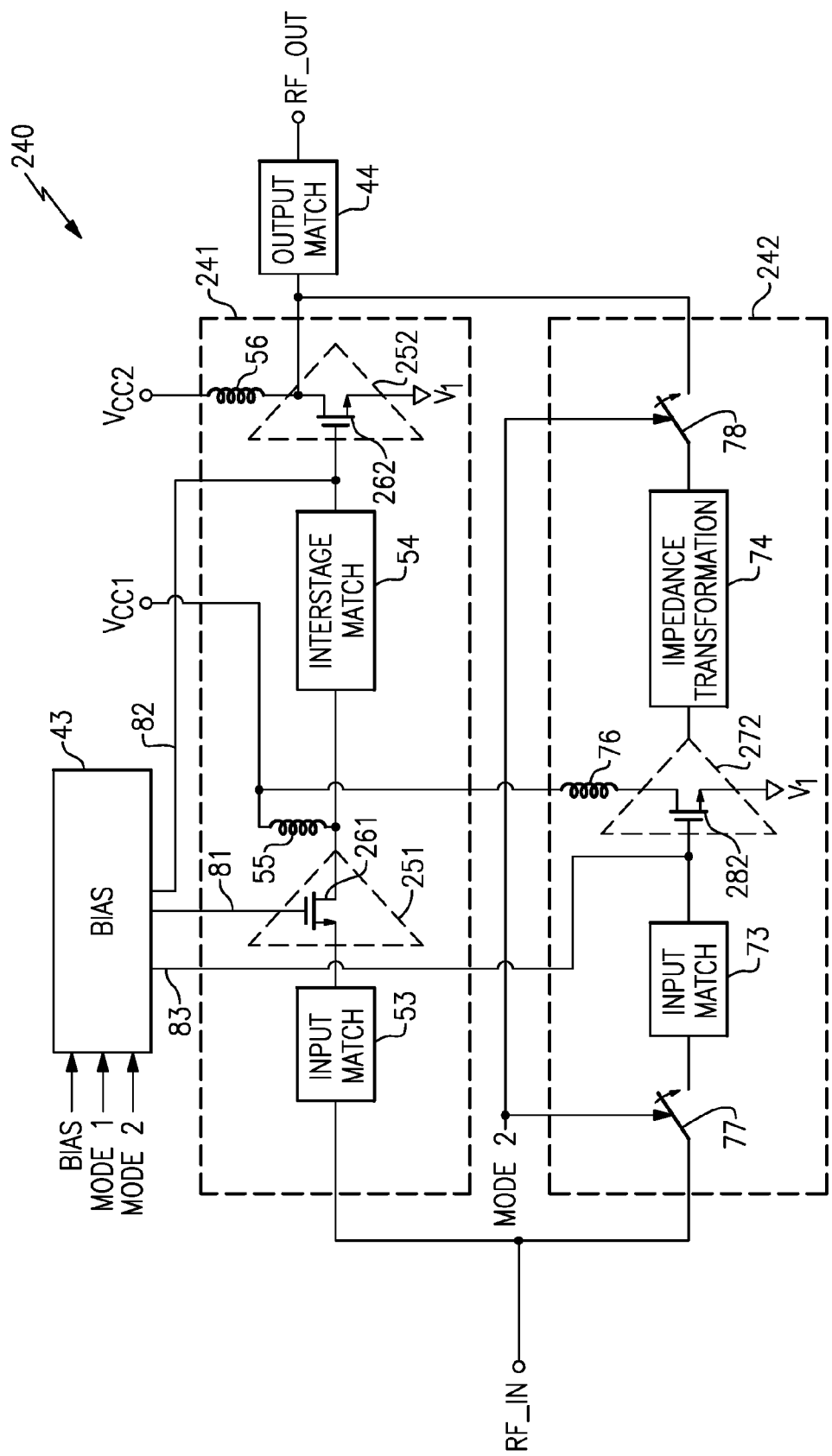
FIG. 6 is a schematic diagram of another embodiment of a multi-mode power amplifier.

FIG. 6 is a schematic diagram of another embodiment of a multi-mode power amplifier 240. The power amplifier 240 includes a first amplification path 241, a second amplification path 242, a bias circuit 43, and an output matching circuit 44. The power amplifier 240 further includes a radio frequency input RF_IN and a radio frequency output RF_OUT.

The multi-mode power amplifier 240 of FIG. 6 is similar to the multi-mode power amplifier 40 of FIG. 4, except that the multi-mode power amplifier 240 of FIG. 6 includes amplification paths implemented using FETs instead of bipolar transistors. In particular, the first amplification path 241 includes common-gate input stage 251 including a first FET 261 and a common-source output stage 252 including a second FET 262. Additionally, the second amplification path 242 includes common-source output stage 272 including a third FET 282. As shown in FIG. 6, the first FET 261 receives the first bias signal 81 from the bias circuit 43, the second FET 262 receives the second bias signal 82 from the bias circuit 43, and the third FET 272 receives the third bias signal 83 from the bias circuit 43.

Additional details of the multi-mode power amplifier 240 can be similar to those described earlier.

Figure 7:
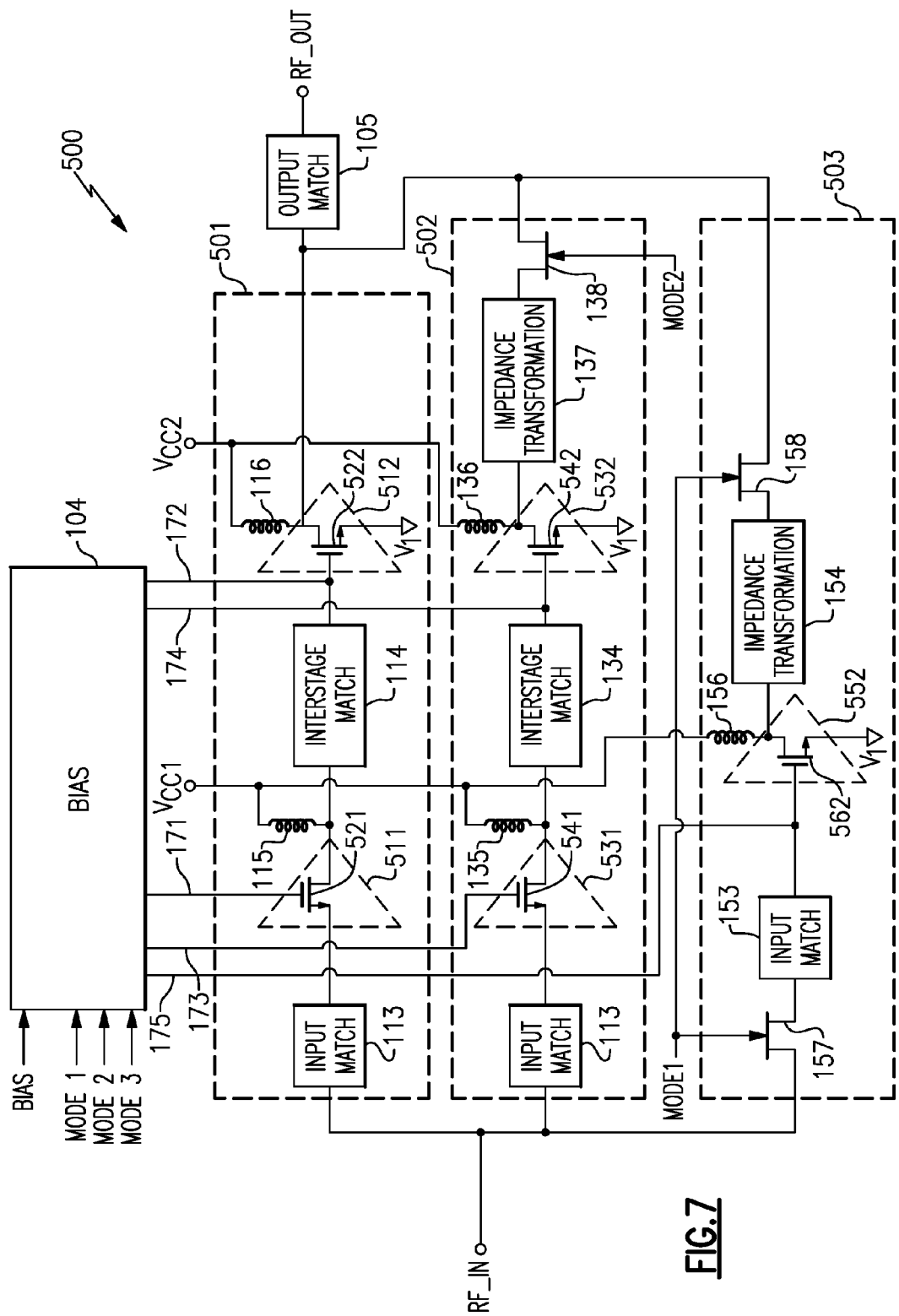
FIG. 7 is a schematic diagram of another embodiment of a multi-mode power amplifier.

FIG. 7 is a schematic diagram of another embodiment of a multi-mode power amplifier 500. The power amplifier 500 includes a first amplification path 501, a second amplification path 502, a third amplification path 503, a bias circuit 104, and an output matching circuit 105. The power amplifier 500 further includes an RF input RF_IN and a radio frequency output RF_OUT.

The multi-mode power amplifier 500 of FIG. 7 is similar to the multi-mode power amplifier 100 of FIG. 5, except that the multi-mode power amplifier 500 of FIG. 7 includes amplification paths implemented using FETs instead of bipolar transistors. In particular, the first amplification path 501 includes a common-gate input stage 511 including a first FET 521 and a common-source output stage 512 including a second FET 522. Additionally, the second amplification path 502 includes a common-gate input stage 531 including a third FET 541 and a common-source output stage 532 including a fourth FET 542. Furthermore, the third amplification path 503 includes a common-source output stage 552 including a fifth FET 562.

As shown in FIG. 7, the first to fifth FETs receive the first to fifth bias signals 171-175, respectively, from the bias circuit 104.

Figure 8A:
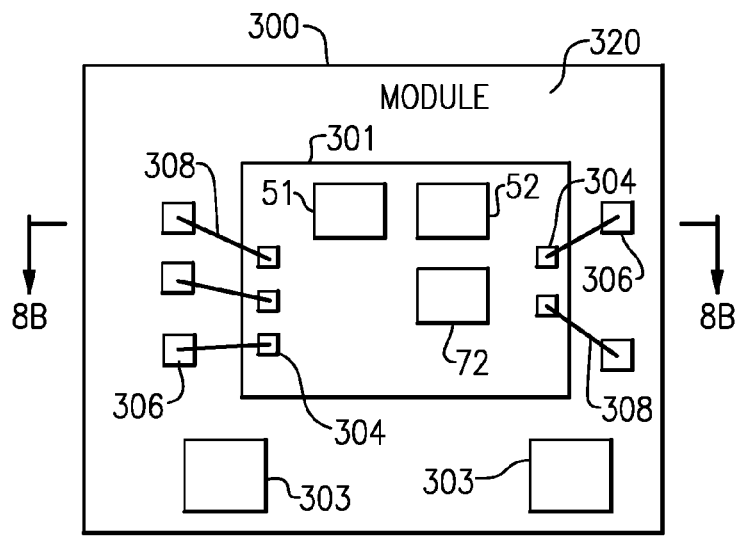
FIG. 8A is a schematic diagram of one embodiment of a packaged module.
Figure 8B:
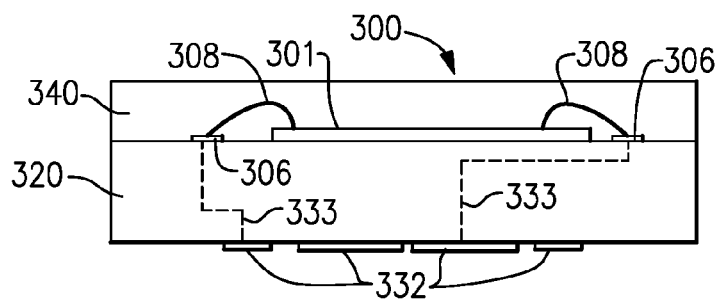
FIG. 8B is a schematic diagram of a cross-section of the packaged module of FIG. 8A taken along the lines 8B-8B.

FIG. 8A is a schematic diagram of one embodiment of a packaged module 300. FIG. 8B is a schematic diagram of a cross-section of the packaged module 300 of FIG. 8A taken along the lines 8B-8B.

The packaged module 300 includes an IC or die 301, surface mount components 303, wirebonds 308, a package substrate 320, and encapsulation structure 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

The die 301 includes a multi-mode power amplifier including a first amplification path that includes a common-base input stage 51 and a common-emitter output stage 52, and a second amplification path that includes a common-emitter output stage 72, which can be as described earlier. In certain embodiments, the die 301 further includes a bias circuit 43, one or more additional amplification paths, and/or other circuitry or structures. For example, any of the multi-mode power amplifiers described herein can be implemented in a packaged module.

The packaging substrate 320 can be configured to receive a plurality of components such as the die 301 and the surface mount components 303, which can include, for example, surface mount capacitors and/or inductors.

As shown in FIG. 8B, the packaged module 300 is shown to include a plurality of contact pads 332 disposed on the side of the packaged module 300 opposite the side used to mount the die 301. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 8B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 9:
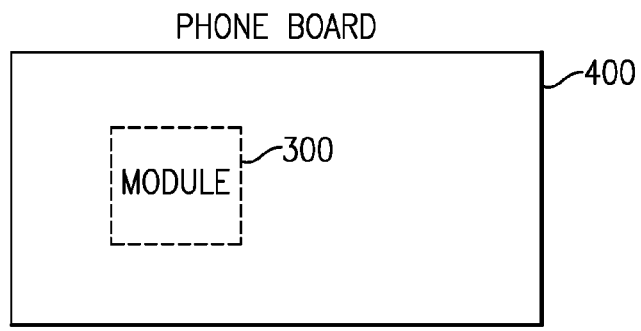
FIG. 9 is a schematic diagram of one embodiment of a phone board.

FIG. 9 is a schematic diagram of one embodiment of a phone board 400. The phone board 400 includes the module 300 shown in FIGS. 8A-8B attached thereto. Although not illustrated in FIG. 9 for clarity, the phone board 400 can include additional components and structures.

Applications

Some of the embodiments described above have provided examples in connection with wireless devices or mobile phones. However, the principles and advantages of the embodiments can be used for any other systems or apparatus that have needs for multi-mode power amplifiers.

Such multi-mode power amplifiers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless device comprising:
    a multi-mode power amplifier including a plurality of amplification paths electrically connected in parallel with one another, the plurality of amplification paths including a first amplification path including an input stage of a first stage type and an output stage of a second stage type, a second amplification path having a fewer number of stages relative to the first amplification path and including an output stage of the second stage type, and a third amplification path including an input stage of the first stage type and an output stage of the second stage type, the first stage type providing non-inverting gain and the second stage type providing inverting gain; and
    a transceiver configured to provide a radio frequency signal to the multi-mode power amplifier, and to operate the multi-mode power amplifier in a selected power mode chosen from a plurality of power modes based on selectively activating one or more of the plurality of amplification paths including the third amplification path.

2. The wireless device of claim 1 wherein each of the plurality of amplification paths has about the same phase such that the multi-mode power amplifier is switchable amongst the plurality of power modes without phase discontinuity.

3. The wireless device of claim 1 wherein the first stage type is a common-base amplifier stage and the second stage type is a common-emitter amplifier stage.

4. The wireless device of claim 1 wherein the first stage type is a common-gate amplifier stage and the second stage type is a common-source amplifier stage.

5. The wireless device of claim 1 wherein the plurality of power modes includes a first power mode in which the first amplification path is activated and the second amplification path is deactivated, and a second power mode in which the first amplification path is deactivated and the second amplification path is activated.

6. The wireless device of claim 1 wherein the power amplifier further includes a bias circuit configured to bias the first amplification path based on the selected power mode.

7. The wireless device of claim 6 wherein the bias circuit is configured to bias two or more of the plurality of amplification paths as a multi-throw switch.

8. The wireless device of claim 1 further comprising a power management system configured to generate one or more power amplifier supply voltages of the plurality of amplification paths based on the selected power mode.

9. A multi-mode power amplifier comprising:
a first amplification path electrically connected between a radio frequency input and a radio frequency output, the first amplification path including an input stage of a first stage type and an output stage of a second stage type, the first stage type providing non-inverting gain and the second stage type providing inverting gain;
a second amplification path electrically connected in parallel with the first amplification path between the radio frequency input and the radio frequency output, the second amplification path having a fewer number of stages relative to the first amplification path and including an output stage of the second stage type;
a third amplification path including an input stage of the first stage type and an output stage of the second stage type; and
a bias circuit configured to bias the first amplification and the second amplification path, the bias circuit configured to receive a mode control signal that is operable to control a power mode of the multi-mode power amplifier based on selectively activating the first amplification path, the second amplification path, and the third amplification path.

10. The multi-mode power amplifier of claim 9 wherein the first amplification path and the second amplification path have about the same phase such that the multi-mode power amplifier is switchable amongst a plurality of power modes without phase discontinuity.

11. The multi-mode power amplifier of claim 9 wherein the first stage type is a common-base amplifier stage and the second stage type is a common-emitter amplifier stage.

12. The multi-mode power amplifier of claim 9 wherein the first stage type is a common-gate amplifier stage and the second stage type is a common-source amplifier stage.

13. The multi-mode power amplifier of claim 9 wherein the multi-mode power amplifier is operable in a plurality of power modes including a first power mode in which the first amplification path is activated and the second amplification path is deactivated, and a second power mode in which the first amplification path is deactivated and the second amplification path is activated.

14. The multi-mode power amplifier of claim 9 wherein the power amplifier is configured to bias the input stage of the second amplification path and the input stage of the third amplification path as a multi-throw switch.

15. The multi-mode power amplifier of claim 9 wherein the first amplification path, the second amplification path, and the third amplification path about the same phase such that the multi-mode power amplifier is switchable amongst a plurality of power modes without phase discontinuity.

16. A packaged module comprising:
a package substrate; and
an integrated circuit on the package substrate, the integrated circuit including a multi-mode power amplifier including a plurality of amplification paths electrically connected in parallel with one another and including a first amplification path including an input stage of a first stage type and an output stage of a second stage type, a second amplification path having a fewer number of stages relative to the first amplification path and including an output stage of the second stage type, and a third amplification path including an input stage of the first stage type and an output stage of the second stage type, the first stage type providing non-inverting gain and the second stage type providing inverting gain, the multi-mode power amplifier further including a bias circuit configured to receive a mode control signal that is operable to control a power mode of the multi-mode power amplifier based on selectively activating one or more of the plurality of amplification paths including the third amplification path.

17. The packaged module of claim 16 wherein each of the plurality of amplification paths has about the same phase such that the multi-mode power amplifier is switchable amongst a plurality of modes without phase discontinuity.

18. The packaged module of claim 16 wherein the first stage type is a common-base amplifier stage and the second stage type is a common-emitter amplifier stage.

19. The packaged module of claim 16 wherein the first stage type is a common-gate amplifier stage and the second stage type is a common-source amplifier stage.

20. The packaged module of claim 16 wherein the bias circuit is further configured to bias two or more of the plurality of amplification paths as a multi-throw switch.

* * * * *